United States Patent
Stephens

(10) Patent No.: US 7,191,080 B2
(45) Date of Patent: Mar. 13, 2007

(54) SEPARATION OF A RANDOM COMPONENT OF JITTER AND A DETERMINISTIC COMPONENT OF JITTER

(75) Inventor: Ransom W. Stephens, Petaluma, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 72 days.

(21) Appl. No.: 11/104,124

(22) Filed: Apr. 12, 2005

(65) Prior Publication Data

US 2006/0229836 A1    Oct. 12, 2006

(51) Int. Cl.
 *G01R 27/00* (2006.01)
(52) U.S. Cl. .......................... 702/69; 702/181
(58) Field of Classification Search ............. 702/69, 702/70, 73, 75–77, 179, 180, 181, 183, 189, 702/190, 191; 714/699; 375/238
See application file for complete search history.

(56) References Cited

U.S. PATENT DOCUMENTS

| | | | |
|---|---|---|---|
| 6,298,315 B1 | 10/2001 | Li et al. | |
| 6,356,850 B1 | 3/2002 | Wilstrup et al. | |
| 6,799,144 B2 * | 9/2004 | Li et al. | 702/180 |
| 6,832,172 B2 * | 12/2004 | Ward et al. | 702/69 |
| 7,016,805 B2 * | 3/2006 | Sun et al. | 702/181 |
| 2003/0115017 A1 | 6/2003 | Sun et al. | |
| 2004/0001194 A1 * | 1/2004 | Wilstrup et al. | 356/73.1 |
| 2004/0146097 A1 | 7/2004 | Jungerman et al. | |
| 2004/0250179 A1 * | 12/2004 | Laquai | 714/699 |
| 2005/0080574 A1 | 4/2005 | Draving | |
| 2005/0286627 A1 * | 12/2005 | Tabatabaei | 375/238 |

FOREIGN PATENT DOCUMENTS

| | | |
|---|---|---|
| EP | 1 267 172 | 12/2002 |
| EP | 1 267 172 A2 | 12/2002 |

OTHER PUBLICATIONS

Jitter Analysis: The dual-Dirac Model, RJ/DJ, and Q-scale, White Paper, Agilent Technologies, Inc., Jan. 5, 2005.
Precision jitter analysis using the Agilent 86100C DCA-J, Agilent Technologies, Inc., Jun. 16, 2004, Part No. 5989-1146EN.
Jitter Fundamentals: Agilent N4900 Serial BERT Series Jitter Injection and Analysis Capabilities Agilent Technologies 2003, Part No. 5989-0089EN.

* cited by examiner

*Primary Examiner*—Marc S Hoff
*Assistant Examiner*—Mohamed Charioui

(57) ABSTRACT

A random component of jitter and a deterministic component of jitter are separated. A measured jitter distribution is obtained. A form is selected for a selected component of jitter. The selected component of jitter is either the random component of jitter or the deterministic component of jitter. A remaining component of jitter is either the random component of jitter or the deterministic component of jitter, whichever is not the selected component of jitter. The selected form for the selected component of jitter is convolved with a generalized function for the remaining component of jitter to produce a resulting equation. The resulting equation is fitted to the measured jitter distribution.

20 Claims, 3 Drawing Sheets ions of the present invention.

SEPARATION OF A RANDOM COMPONENT OF JITTER AND A DETERMINISTIC COMPONENT OF JITTER

BACKGROUND

Jitter is a measure of the timing variations of logic transitions of digital data signals. The standard practice in high-data rate (e.g., greater than 1 gigabit per second (Gb/s)) serial technologies is to analyze jitter in terms of two sub-components: Random Jitter (RJ) and Deterministic Jitter (DJ). These sub-components are separated from the whole jitter distribution for two reasons. The first reason is to provide a diagnostic tool for debugging circuits. The second reason is to facilitate a quick estimate of Total Jitter measured at a given Bit Error Ratio TJ(BER).

The jitter distribution is closely related to the probability density function (PDF) for finding a particular data transition at some distance from the ideal point. The applied jitter signal is the phase modulation applied to the data pattern that determines the timing position of edges. For example, a sinusoidal applied jitter signal $\phi(t)=A \sin(\omega t)$ yields a jitter PDF ($\rho(x)$) that follows Equation 1 below:

$$\rho(x) = \frac{\frac{1}{A}}{\sqrt{1 - \frac{x^2}{A^2}}}.$$ Equation 1

RJ and DJ of a jitter distribution have been separately approximated typically using the double-delta technique (also known as the 'dual-Dirac' technique). In the double-delta technique, two key assumptions are made of the RJ and DJ distributions. The first assumption is that RJ follows a Gaussian distribution. A Gaussian distribution is specified by three parameters, its amplitude, width (represented by the standard deviation σ), and mean value (represented by μ). For jitter analysis the key RJ parameter is the width (standard deviation σ of the Gaussian distribution). The second assumption is that the DJ distribution is assumed to be bounded. The double-delta approximation is built on the assumption that any jitter distribution can be quantitatively described as the sum of two Gaussian distributions of not necessarily equal amplitudes or widths. For more information on the double-delta technique, see for example U.S. Pat. No. 6,298,315 and U.S. Pat. No. 6,356,850.

SUMMARY OF THE INVENTION

In accordance with an embodiment of the present invention, a random component of jitter and a deterministic component of jitter are separated. A measured jitter distribution is obtained. A form is selected for a selected component of jitter. The selected component of jitter is either the random component of jitter or the deterministic component of jitter. A remaining component of jitter is either the random component of jitter or the deterministic component of jitter, whichever is not the selected component of jitter. The selected form for the selected component of jitter is convolved with a generalized function for the remaining component of jitter to produce a resulting equation. The resulting equation is fitted to the measured jitter distribution.

DESCRIPTION OF THE EMBODIMENT

Figure 1:
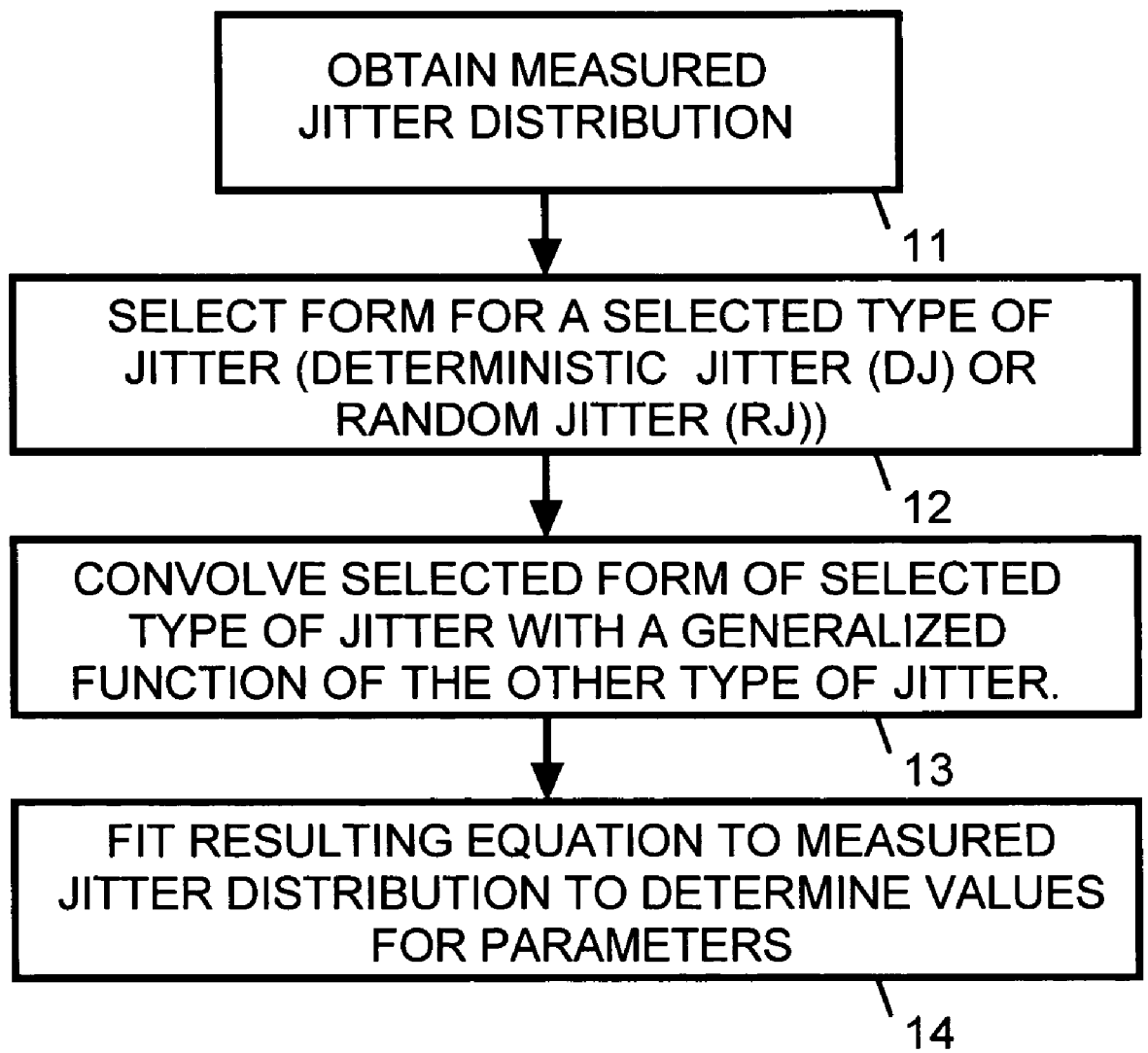
FIG. 1 is a flowchart that illustrates separation of random and deterministic components of jitter in accordance with an embodiment of the present invention.

FIG. 1 is a flowchart that illustrates separation of random and deterministic components of jitter. In a block 11, total measured jitter distribution is obtained from a device under test. This is illustrated by FIG. 2.

Figure 2:
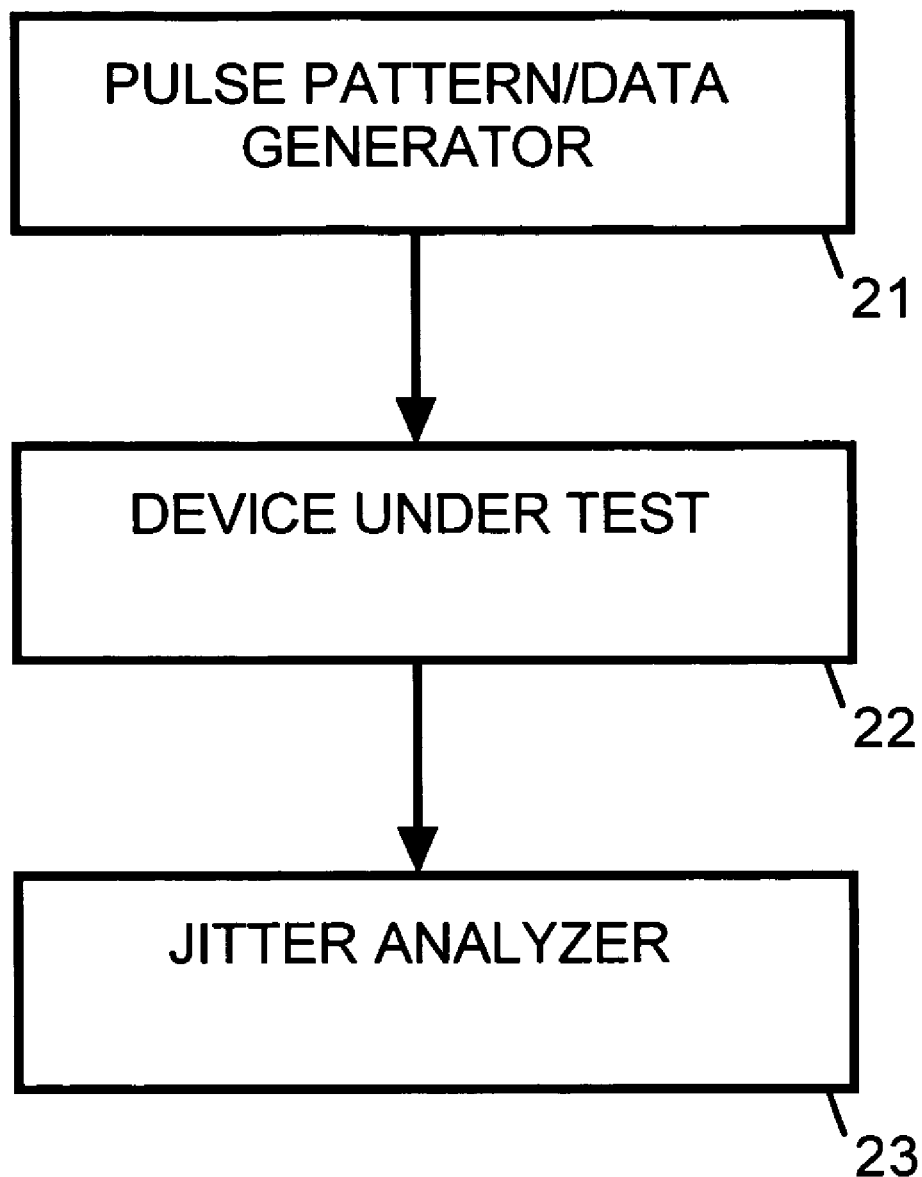
FIG. 2 illustrates a jitter analyzer obtaining a measured jitter distribution from a device under test in accordance with an embodiment of the present invention.
Figure 3:
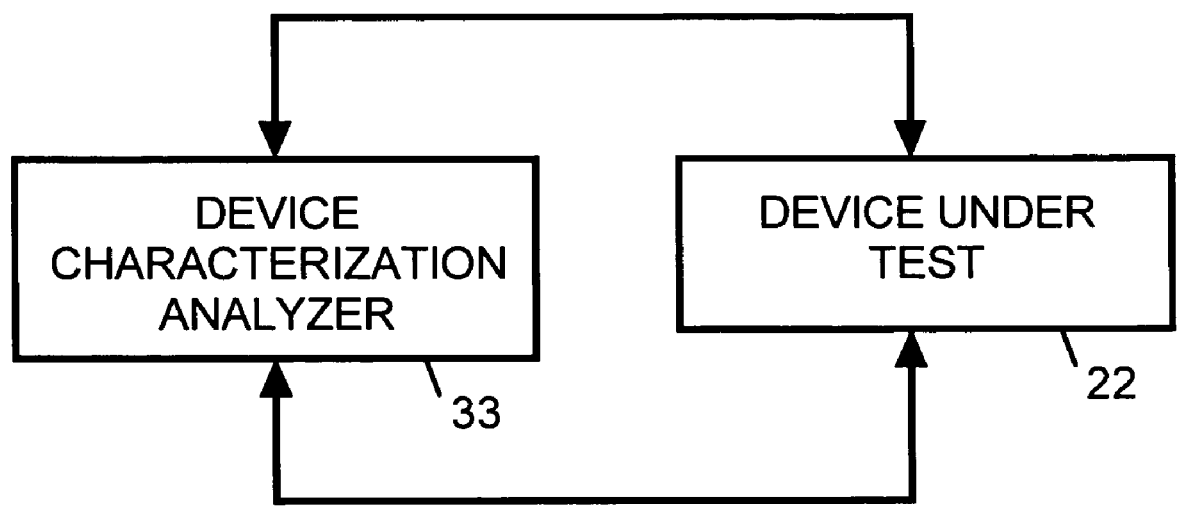
FIG. 3 illustrates a device characterization analyzer obtaining a measured jitter distribution from a device under test in accordance with another embodiment of the present invention.

In FIG. 2, pulse pattern generator or data generator 21 generates a pattern of data for processing by a device under test (DUT) 22. DUT 22 is, for example a transmitter or a transmission channel. A jitter analyzer 23 receives a data signal from DUT 22. Jitter analyzer 23 measures the jitter within data signal to determine a total measured jitter distribution. For example, jitter analyzer 23 is a real-time oscilloscope, a sampling oscilloscope, a time interval analyzer or some other type of analyzer capable of producing a jitter distribution. In an alternative embodiment, FIG. 3 shows a device characterization analyzer 33 providing a pattern of data to DUT 22 and measuring the jitter within the resulting data signal from DUT 22.

In block 12, shown in FIG. 1, either random jitter (RJ) or deterministic jitter (DJ) is selected to have a selected form. For example, DJ is assumed to be bounded. For example, RJ is selected to have a Gaussian form. For example, Equation 2 below shows an example Gaussian probability density function g(x) for RJ:

$$g(x) = \frac{1}{\sqrt{2\pi}\,\sigma} \exp-\frac{x^2}{2\sigma^2}$$ Equation 2

In block 13, the selected form of the selected type of jitter is convolved with a generalized function of the other type of jitter. In block 3, RJ has been selected to have a Gaussian form. Therefore it is necessary to select a generalized function for DJ.

For example, $\rho(x)$, set out in Equation 3 below, is a probability density function (PDF) for DJ.

$$\rho(x) = \sum_{n=0} A_n \exp i(k_n x + \varphi_n)$$ Equation 3

In Equation 3, $\rho(x)$ is described as a Fourier series. This is possible because DJ is bounded and so can be expressed as a Fourier series. Since the Fourier representation of functions is most commonly used to transform between the time and frequency domains it is important to distinguish that the Fourier series representation of the jitter distribution is not related to the jitter frequency spectrum. It is, rather, a transformation from the relative time domain of the position of logic transitions with respect to their ideal positions to an abstract Fourier space. To reduce confusion, the Fourier series is described below in wave number rather than frequency phase space. That is, if $$\lambda_n = \frac{2T}{n},$$

then the wave number for the Fourier series expansion is $$k_n = \frac{\pi n}{T}.$$

T can be any number equal to or larger than the peak-to-peak value of the DJ distribution. For example T is the peak-to-peak value of the measured jitter distribution.

The convolution of g(x) and ρ(x) is given by Equation 4 below:

$$g(x) * \rho(x) = \int g(u)\rho(x-u)du \quad \text{Equation 4}$$

$$= \frac{1}{\sqrt{2\pi}\,\sigma} \int A_0 \exp\left(-\frac{u^2}{2\sigma^2}\right) + \sum_{n=0} A_n \exp$$

$$\left(-\frac{u^2}{2\sigma^2} + ik_n(x-u) + i\varphi_n\right)du$$

$$= \frac{A_0}{\sqrt{2}\,\sigma} + \frac{1}{\sqrt{2\pi}\,\sigma} \sum_{n=1} A_n \exp i(k_n x + \varphi_n) \int \exp -$$

$$\left(\frac{u^2}{2\sigma^2} + ik_n u\right)du$$

The convolution set out in Equation 4 can be solved by completing the square, as illustrated by Equation 5 below:

$$g(x) * \rho(x) = \frac{A_0}{\sqrt{2}\,\sigma} + \frac{1}{\sqrt{2\pi}\,\sigma} \sum_{n=1} A_n \exp \quad \text{Equation 5}$$

$$\left(-\frac{k_n^2 \sigma^2}{2} + i(k_n x + \varphi_n)\right) \int \exp -$$

$$\left(\frac{u}{\sqrt{2}\,\sigma} + \frac{ik_n \sigma}{\sqrt{2}}\right)^2 du$$

$$= \frac{A_0}{\sqrt{2}\,\sigma} + \frac{1}{\sqrt{\pi}} \sum_{n=1} A_n \exp$$

$$\left(-\frac{k_n^2 \sigma^2}{2} + i(k_n x + \varphi_n)\right) \int \exp -z^2 du$$

$$= \frac{A_0}{\sqrt{2}\,\sigma} + \sum_{n=1} A_n \exp\left(-\frac{k_n^2 \sigma^2}{2} + i(k_n x + \varphi_n)\right)$$

In Equation 6 below, all the free parameters of the convolution are identified:

$$g(x) * \rho(x) = \frac{A_0}{\sqrt{2}\,\sigma} + \sum_{n=1} A_n \exp\left(-\frac{n^2 \pi^2 \sigma^2}{2T^2} + i\left(\frac{n\pi x}{T} + \varphi_n\right)\right). \quad \text{Equation 6}$$

Since the convolution is real, the imaginary part can be omitted, and the remaining real part is as is set out in Equation 7 below:

$$g(x) * \rho(x) = \quad \text{Equation 7}$$

$$\frac{A_0}{\sqrt{2}\,\sigma} + \sum_{n=1} \exp\left(-\frac{n^2 \pi^2 \sigma^2}{2T^2}\right)\left[C_n \cos\frac{n\pi x}{T} - D_n \sin\frac{n\pi x}{T}\right]$$

In Equation 7, $C_n = A_n \cos \phi_n$ and $D_n = A_n \sin \phi_n$ so that $A_n^2 = C_n^2 + D_n^2$ and $\phi_n = \arctan D_n/C_n$.

By redefining the parameters, Equation 7 can be recast as Equation 8 below:

$$f(x) = K + \sum_{n=1}\left[E_n \cos\frac{n\pi x}{T} - F_n \sin\frac{n\pi x}{T}\right] \quad \text{Equation 8}$$

In block 14 of FIG. 1, the equation resulting from the convolution is fit to the measured distribution obtained in Block 11 in order to obtain values for the parameters in the equation. For example, either Equation 7 or Equation 8 can be used as the equation resulting from the convolution. Standard fitting techniques such as a least $\chi^2$ or a maximum likelihood fit can be used to fit the equation resulting from the convolution to the measured distribution obtained in block 11.

For example, in Equation 7 there are 1+2n free parameters: $A_0$, $C_n$, and $D_n$. Alternatively, the 1+2n free parameters $A_0$, $A_n$, and $\phi_n$, can be used. In Equation 8, there are 1+2n free parameters: K, $E_n$, and $F_n$. Since the first few harmonics dominate the sum, to get quick smooth convergence, the number of terms included from the equation can be increased in subsequent fits of the parameterization to the jitter histogram.

A variety of techniques can be used to encourage smooth convergence and an accurate fit. For example, the histogram bins can be combined to get a gross estimate where n=1 and only three parameters are utilized. The histogram bins are the data points of the measured distribution. Then, in a next iteration, n can be increased incrementally and a new fit obtained for additional parameters. For example, the iterations continue with increased n until a fit converges.

Alternatively, a determinant fit can be performed letting the number of free parameters be equal to the number of histogram bins in the histogram.

When the fit is complete, the parameters in the resulting equation are extracted. For example, when Equation 7 is used, the extracted parameters are σ, $A_0$, $C_n$, and $D_n$ (or alternatively, σ, $A_0$, $A_n$, and $\phi_n$). Equation 3, above, gives the DJ component of jitter.

The standard deviation value, σ, that defines the RJ component of jitter, can either be included as a parameter in the fit or provided to the fit from another measurement of the system, for example from a spectral technique. For an example of spectral techniques that can be used in jitter analysis, see European Patent Application EP1267172A2 by Benjamin A. Ward et al. for "Apparatus and method for spectrum analysis-based serial data jitter measurement" published Dec. 18, 2002. For example, the measurement of the RJ component of jitter using spectral techniques typically requires an a priori threshold decision to distinguish the RJ component of jitter from DJ components of jitter. The threshold can be tuned empirically by providing the initial value for σ from a spectral technique with some arbitrary threshold assumption, then allowing the Fourier technique for the deconvolution of jitter distributions to provide another estimate of σ, then adjusting the threshold in the spectral technique so that its estimate of σ either increases or decreases depending on the difference of the original spectral technique value and the most recent Fourier technique value and iterating until the two techniques agree. If the techniques do not converge to a common answer this would indicate that the RJ component of the jitter does not follow a Gaussian distribution in the time domain. This would be a key discovery in the analysis of the jitter of a system. It is possible that the RJ component of the jitter may not follow a Gaussian distribution. Using the above described techniques for the deconvolution of jitter distributions to check if the RJ component of the jitter follows a Gaussian distribution provides an unambiguous indicator of whether or not it does.

The DJ distribution, set out in Equation 3, derived by the Fourier technique for the deconvolution of jitter distributions may not result in a function that is obviously bounded. The primary cause is that the number of Fourier coefficients is necessarily finite. There are many approaches to limiting the distribution and, for most, functions, they are known to persons of ordinary skill in the art. For example, the jitter distribution is positive definite, but the fit is not. The points where the DJ distribution crosses the x axis are obvious choices for setting the empirical limit on the DJ distribution. Another approach is to develop the technique through simulation and compare the derived parameterization, in Equation 3, with the true distribution implemented in the simulation. A default approach can be to use the noise level of the detector as a convergence-like criteria so that the DJ distribution is bounded by the two extrema at which |ρ(x)| is less than the noise level, as defined by the RJ component of jitter.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A method for separating a random component of jitter and a deterministic component of jitter comprising the following:
   obtaining a measured jitter distribution;
   selecting a form for a selected component of jitter, the selected component of jitter being one of the random component of jitter and the deterministic component of jitter, a remaining component of jitter being one of the random component of jitter and the deterministic component of jitter that is not the selected component of jitter;
   convolving the selected form for the selected component of jitter with a generalized function for the remaining component of jitter to produce a resulting equation;
   fitting the resulting equation to the measured jitter distribution to obtain values for parameters in the resulting equation, the values for the parameters, when used in the selected form for the selected component of jitter and the generalized function for the remaining component of jitter, allowing separation of the random component of jitter and the deterministic component of jitter; and,
   storing the values for the parameters.

2. A method as in claim 1 wherein the selected component of jitter is the random component of jitter and the remaining component of jitter is the deterministic component of jitter.

3. A method as in claim 1 wherein the selected component of jitter is the random component of jitter and the selected form is a Gaussian form.

4. A method as in claim 1 wherein the generalized function is described as a Fourier series.

5. A method as in claim 1 wherein the selected component of jitter is the random component of jitter and the selected form is a Gaussian form as set out in the following equation:

$$g(x) = \frac{1}{\sqrt{2\pi}\sigma} \exp - \frac{x^2}{2\sigma^2}.$$

6. A method as in claim 1 wherein the generalized function is a Fourier series having the following form:

$$\rho(x) = \sum_{n=0} A_n \exp i(k_n x + \varphi_n).$$

7. A method as in claim 1 wherein the selected component of jitter is the random component of jitter and the selected form is a Gaussian form as set out in the following equation:

$$g(x) = \frac{1}{\sqrt{2\pi}\sigma} \exp - \frac{x^2}{2\sigma^2}; \text{ and,}$$

the generalized function is a Fourier series having the following form:

$$\rho(x) = \sum_{n=0} A_n \exp i(k_n x + \varphi_n).$$

8. A method as in claim 1 additionally comprising the following:
   using the values for the parameters, obtained by fitting the resulting equation to the measured jitter distribution, to obtain a value for the remaining component of jitter.

9. A method as in claim 1 additionally comprising the following:
   using the values for the parameters, obtained by fitting the resulting equation to the measured jitter distribution, to obtain a value for selected component of jitter and the remaining component of jitter.

10. A method as in claim 1 additionally comprising the following:
    checking to determine whether the selected component of jitter follows the selected form for the selected component of jitter.

11. A method for separating a random component of jitter and a deterministic component of jitter from a measured jitter distribution, comprising the following:
    selecting a form for a selected component of jitter, the selected component of jitter being one of the random component of jitter and the deterministic component of jitter, a remaining component of jitter being one of the random component of jitter and the deterministic component of jitter that is not the selected component of jitter;
    convolving the selected form for the selected component of jitter with a generalized function for the remaining component of jitter to produce a resulting equation;

fitting the resulting equation to the measured jitter distribution to obtain values for parameters in the resulting equation, the values for the parameters, when used in the selected form for the selected component of jitter and the generalized function for the remaining component of jitter, allowing separation of the random component of jitter and the deterministic component of jitter; and, storing the values for the parameters.

12. A method as in claim 11 wherein the selected component of jitter is the random component of jitter and the remaining component of jitter is the deterministic component of jitter.

13. A method as in claim 11 wherein the selected component of jitter is the random component of jitter and the selected form is a Gaussian form.

14. A method as in claim 11 wherein the generalized function is described as a Fourier series.

15. A method as in claim 11 wherein the selected component of jitter is the random component of jitter and the selected form is a Gaussian form as set out in the following equation:

$$g(x) = \frac{1}{\sqrt{2\pi}\sigma} \exp - \frac{x^2}{2\sigma^2}.$$

16. A method as in claim 11 wherein the generalized function is a Fourier series having the following form:

$$\rho(x) = \sum_{n=0} A_n \exp i(k_n x + \varphi_n).$$

17. A method as in claim 11 wherein the selected component of jitter is the random component of jitter and the selected form is a Gaussian form as set out in the following equation:

$$g(x) = \frac{1}{\sqrt{2\pi}\,\sigma} \exp - \frac{x^2}{2\sigma^2}; \text{ and,}$$

the generalized function is a Fourier series having the following form:

$$\rho(x) = \sum_{n=0} A_n \exp i(k_n x + \varphi_n).$$

18. A method as in claim 11 additionally comprising the following:

using parameter values, obtained by fitting the resulting equation to the measured jitter distribution, to obtain a value for selected component of jitter and the remaining component of jitter.

19. A method as in claim 11 additionally comprising the following:

checking to determine whether the selected component of jitter follows the selected form for the selected component of jitter.

20. A method for separating a random component of jitter and a deterministic component of jitter comprising the following:

obtaining a measured jitter distribution;

selecting a form for a selected component of jitter, the selected component of jitter being one of the random component of jitter and the deterministic component of jitter, a remaining component of jitter being one of the random component of jitter and the deterministic component of jitter that is not the selected component of jitter;

convolving the selected form for the selected component of jitter with a generalized function for the remaining component of jitter to produce a resulting equation;

fitting the resulting equation to the measured jitter distribution to obtain values for parameters in the resulting equation, the values for the parameters, when used in the selected form for the selected component of jitter and the generalized function for the remaining component of jitter, allowing separation of the random component of jitter and the deterministic component of jitter; and, communicating to a user results from fitting the resulting equation to the measured jitter distribution.

* * * * *

UNITED STATES PATENT AND TRADEMARK OFFICE
CERTIFICATE OF CORRECTION

PATENT NO.        : 7,191,080 B2
APPLICATION NO.   : 11/104124
DATED             : March 13, 2007
INVENTOR(S)       : Stephens It is certified that error appears in the above-identified patent and that said Letters Patent is hereby corrected as shown below:

In column 6, lines 11-12 (Approx.), in Claim 5, delete "$\dfrac{1}{\sqrt{2\pi\sigma}}$" and insert -- $\dfrac{1}{\sqrt{2\pi}\sigma}$ --, therefor.

In column 6, lines 19-20 (Approx.), in Claim 6, delete "exp$\textit{i}$" and insert -- exp $\textit{i}$ --, therefor.

In column 6, lines 28-29 (Approx.), in Claim 7, delete "$\dfrac{1}{\sqrt{2\pi\sigma}}$" and insert -- $\dfrac{1}{\sqrt{2\pi}\sigma}$ --, therefor.

In column 6, lines 35-36 (Approx.), in Claim 7, delete "exp$\textit{i}$" and insert -- exp $\textit{i}$ --, therefor.

In column 7, lines 26-27 (Approx.), in Claim 15, delete "$\dfrac{1}{\sqrt{2\pi\sigma}}$" and insert -- $\dfrac{1}{\sqrt{2\pi}\sigma}$ --, therefor.

In column 7, lines 34-35 (Approx.), in Claim 16, delete "exp$\textit{i}$" and insert -- exp $\textit{i}$ --, therefor.

UNITED STATES PATENT AND TRADEMARK OFFICE
CERTIFICATE OF CORRECTION

PATENT NO. : 7,191,080 B2
APPLICATION NO. : 11/104124
DATED : March 13, 2007
INVENTOR(S) : Stephens It is certified that error appears in the above-identified patent and that said Letters Patent is hereby corrected as shown below:

In column 8, line 5 (Approx.), in Claim 17, delete "exp$i$" and insert

-- exp $i$ --, therefor.

Signed and Sealed this

Tenth Day of July, 2007

JON W. DUDAS
*Director of the United States Patent and Trademark Office*